United States Patent [19]
Nakano et al.

[11] Patent Number: 4,566,116
[45] Date of Patent: Jan. 21, 1986

[54] SOFT X-RAY GENERATOR

[75] Inventors: Asao Nakano; Yutaka Hiratsuka, both of Yokohama, Japan

[73] Assignee: Hitachi, Ltd., Tokyo, Japan

[21] Appl. No.: 488,758

[22] Filed: Apr. 26, 1983

[30] Foreign Application Priority Data

Apr. 30, 1982 [JP] Japan .................................. 57-71201
Jul. 26, 1982 [JP] Japan .................................. 57-128913

[51] Int. Cl.$^4$ ..................... H01J 35/00; H01J 35/10; H01J 35/14; H01J 5/18
[52] U.S. Cl. ................................ 378/121; 378/130; 378/138; 378/140; 378/141
[58] Field of Search .............. 378/123, 138, 161, 34, 378/43

[56] References Cited

U.S. PATENT DOCUMENTS

| 2,075,146 | 3/1937 | Sergeeff | 378/130 |
| 2,878,393 | 3/1959 | Graves | 378/138 |
| 3,617,788 | 11/1971 | Goorissen et al. | 378/161 |
| 4,185,202 | 1/1980 | Dean et al. | 378/34 |
| 4,196,367 | 4/1980 | Diemer et al. | 378/161 |

FOREIGN PATENT DOCUMENTS 924078  7/1947  France .................................. 378/138

*Primary Examiner*—Alfred E. Smith
*Assistant Examiner*—T. N. Grigsby
*Attorney, Agent, or Firm*—Antonelli, Terry & Wands

[57] ABSTRACT

A soft X-ray generator comprises an electron gun and an anode which are disposed in individual vacuum containers, respectively but are interconnected by a conduit provided with an electron lens so that an electron beam generated from the electron gun is guided through the conduit on the anode in a focused form, thereby emitting soft X-rays from the surface of the anode.

11 Claims, 7 Drawing Figures

SOFT X-RAY GENERATOR

The present invention relates to a soft X-ray generator which can be advantageously used as an X-ray source for an X-ray lithography or exposing system being developed and employed as an equipment for manufacturing very large scale integrated circuits (VLSIs).

In fabrication of the VLSIs, it is required to form extremely fine circuit patterns whose line widths are of the order of 1 μm or less, which in turn requires that a resist film on a wafer is exposed and formed with correspondingly fine circuit patterns with a resolution higher than 1 μm.

There have been developed an electron-beam lithography system and an X-ray lithography system, as the apparatus for forming the fine circuit patterns.

In the case of the electron-beam lithography system, fine circuit patterns of the resist film on the wafer is directly exposed to and formed by a fine electron beam with less than 1 μm in diameter. Consequently, the exposure of the circuit patterns of a single VLSI requires a great deal of time, making it impractical to expect a high throughput (i.e. productivity per unit time), Furthermore, the apparatus for the electron beam lithography is necessarily bulky, complicated and expensive, the wafer has to be placed in a high vacuum. Under such circumstances, the electron-beam lithography system is not employed widely for practical applications but used only for the experimental purposes in laboratories or institutes. The apparatus for the electron-beam lithography is not yet on the way to the manufacturing on a mass production base.

The X-ray lithography system comprises a soft X-ray generator and an alignment device which is used for positionally aligning a mask and an wafer with each other. The soft X-ray generator is composed of an electron gun and an anode disposed in high vacuum. In order to generate soft X-rays with wavelength in the range of 0.4 to 1.3 nm, the anode is irradiated with an electron beam from the electron gun. The mask and the wafer aligned in position are exposed with the soft X-rays, whereby the mask pattern is transferred to the wafer. With the aid of such X-ray lithography system, a whole circuit pattern for a single VLSI can be transferred onto the wafer by a single exposure or shot of the soft X-rays. Thus, a higher throughput can be expected, as compared with the aforementioned electron-beam lithography system. Furthermore, there are following advantages in the X-ray lithography system. There arises no problems of diffraction and refraction because of the short wavelength of the soft X-rays. The soft X-rays can transmit through dusts or other particles adhering to the mask and/or the resist films on the wafer. Therefore, even an extremely fine pattern can be transferred onto the wafer with high fidelity.

On the other hand, the soft X-rays undergo significant attenuation in the course of travelling from an X-ray generating point to a location to be exposed to the X-rays. Especially, the soft X-rays are a kind of electromagnetic waves, the flux density thereof decreases in proportion to square of the distance from the origination of the X-rays. As the consequence, the flux density of the X-rays at the origination (i.e. soft X-ray generating point) has to be considerably high in order to assure an adequate flux density of the soft X-rays reaching the resist film on the wafer to thereby realize the high throughput. In other words, it is required to increase the current of the electron beam with which the anode is to be irradiated, which in turn means that the electron gun of an increased capacity and size is required. In this conjunction, there arises however another problem that the use of the large sized electron gun necessarily results in the increase of the distance between the soft X-rays generating point and the location to be exposed to the X-rays, which means that the increase in the output power of the electron gun is not straightforwardly reflected as a corresponding increase in the flux density of the soft X-rays reaching the resist film. Under such circumstance, an impractically large size of the soft X-ray generator which is of course extremely expensive will be required when the adequate flux density of the soft X-rays has to be attained on the resist film. Moreover, when the size of the electron gun is increased, the diameter of a focal spot formed on the anode through irradiation with the electron beam is increased, so that an area where the soft X-rays are generated is also increased correspondingly. This means that difference in positions at which the individual soft X-rays reach the resist film becomes great, giving rise to remarkable penumbra blur. It should further be mentioned that the soft X-rays are generated not at the surface of the anode irradiated with the electron beam but at a slight interior region located within the mass of the anode material with some distance from the surface. As the consequence, the soft X-rays undergo initial attenuation in the course of travelling through the mass of anode material. Since the magnitude of this attenuation is in proportion to the travelling distance within the anode material, the intensity of the soft X-rays irradiated from the anode varies in dependence on the irradiated positions on the resist film. Consequently, distribution of the flux density of the soft X-rays irradiating the resist film becomes nonuniform, involving unevenness in the exposure of the irradiated resist film. For these reasons, the X-ray lithography apparatus is also not yet in the state to be manufactured on a large scale production base.

Taylor et al, Rev. Sci. Instrum. Vol. 26, July 1949, pp. 225–229 discloses an X-ray tube in which an anode is adapted to be rotatable and the anode and an electron gun are disposed in the same vacuum container.

It is an object of the present invention to provide a soft X-ray generator which allows an electron gun of an increased output power to be used without increasing the distance between a soft X-ray generating point and a location to be exposed to the soft X-rays.

Another object of the invention is to provide a soft X-ray generator which allows a pattern transfer process to be carried out with an increased throughput by utilizing the soft X-rays of high flux density.

A further object of the invention is to provide a soft X-ray generator for an X-ray lithography equipment which is suited for the manufacturing on a mass production base.

To that end, the present invention provides a soft X-ray generator which comprises an anode and an electron gun disposed in respective vacuum containers provided separately from each other, the vacuum containers being interconnected by a conduit provided with an electron lens, whereby an electron beam from the electron gun is directed through the conduit to be focused onto the anode for irradiation thereof.

The present invention will be described referring to the accompanying drawings, in which.

Figure 1:
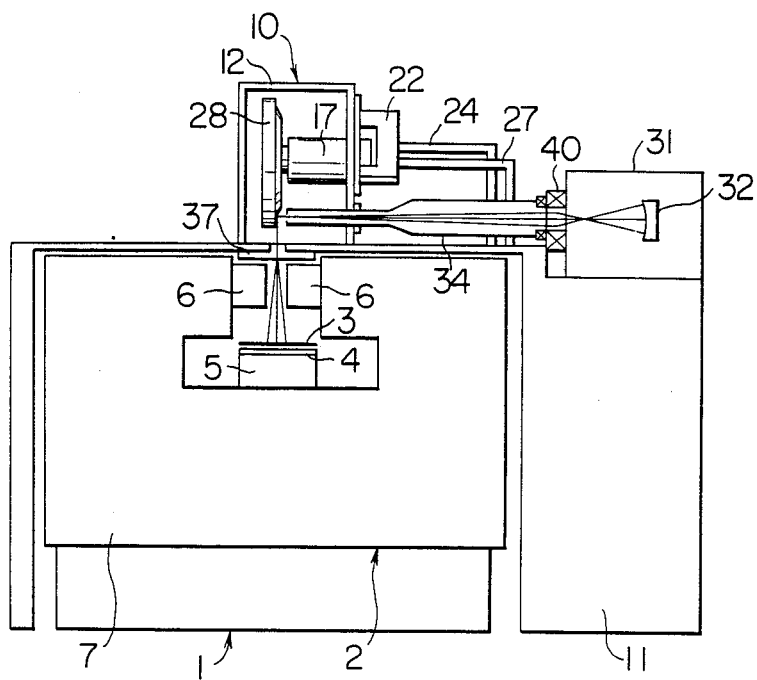
FIG. 1 is a view showing a general structure of an X-ray lithography apparatus incorporating a soft X-ray generator according to an embodiment of the invention.
Figure 2:
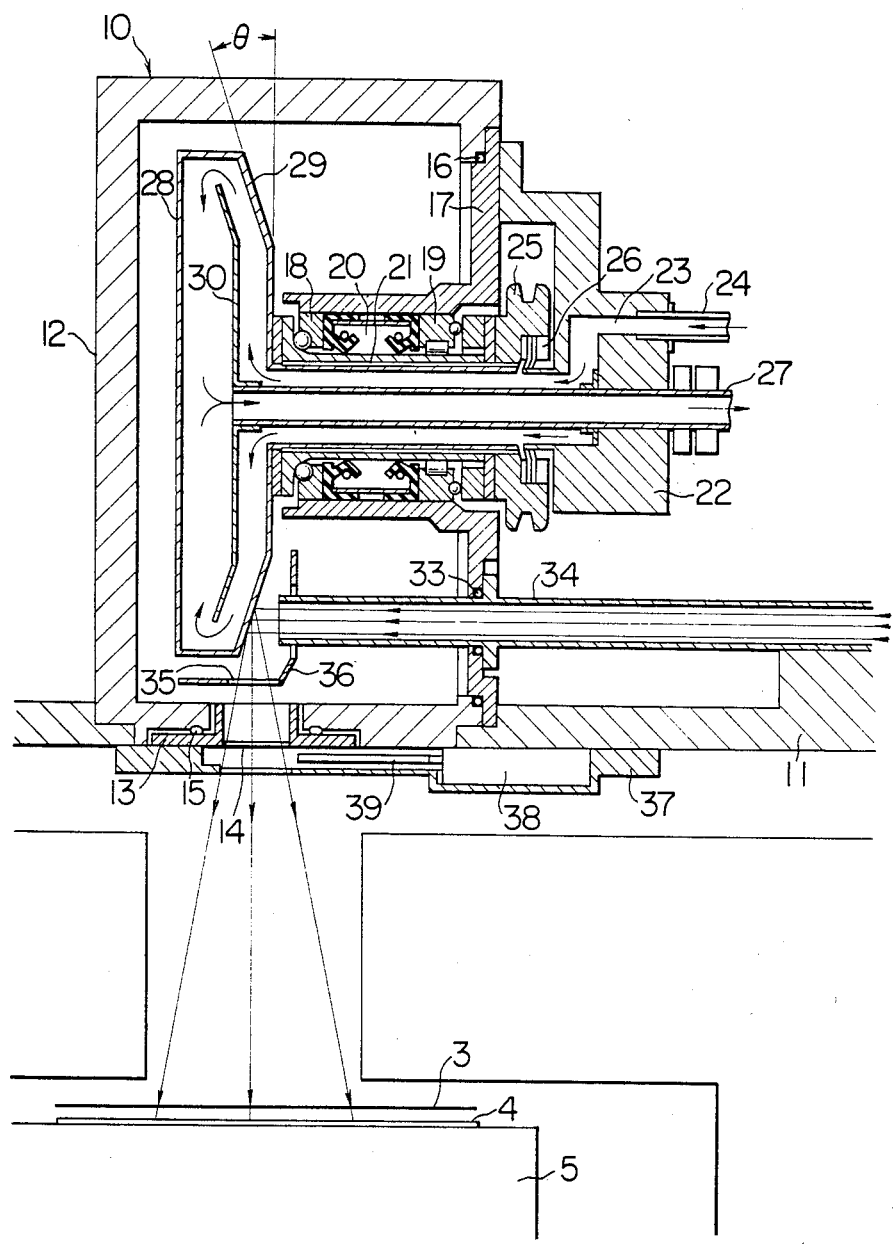
FIG. 2 is a front sectional view showing a main portion of the soft X-ray generator shown in FIG. 1.

Referring to FIG. 1 which show an X-ray lithography system incorporating a soft X-ray generator according to an embodiment of the present invention, the X-ray lithography system 1 generally comprises an alignment device 2 and the soft X-ray generator 10 a main portion of which is shown in FIG. 2. The alignment device 2 includes a table 5 for supporting a mask 3 and a substrate 4 one or both of which are moved relative to each other for accomplishing desired positional alignment therebetween, an optical alignment detecting system 6 for detecting alignment marks formed in the mask 3 and the substrate 4 and a control system (not shown) for electrically processing a detection signal output of the optical alignment detecting system 6 to produce a corresponding command signal for controlling the table 5. The alignment device 2 is supported within an enclosure 7. The soft X-ray generating apparatus 10 is supported by a frame structure 11 and disposed above the alignment device 2. A vacuum container 12 is also supported by the frame structure 11 and has a bottom on which a window member 14 of beryllium is mounted by means of a holder 13. An O-ring 15 is interposed between the holder 13 and the vacuum container 12 to assure a hermetically sealed state. A bearing assembly 17 mounted on a side wall of the vacuum container 12 in the hermetically sealed state by means of an O-ring 16 and projecting into the interior of the vacuum container 12 has a pair of bearings 18 and 19 through which a water feeding tube 21 is rotatably supported with a sealing member 20 being interposed between the bearings 18 and 19 in hermetic contact with the water feeding tube 21. A housing 22 is supported on an externally exposed wall portion of the bearing assembly 17 and has a cooling water supply passage 23 formed therein in opposition to one end of the water feeding tube 21, whereby the latter is communicated to a cooling water supply pipe 24 by way of the passage 23. A pulley 25 for power transmission is mounted on the water feeding tube 22 at an end portion thereof. A seal member 26 disposed between the pulley 25 and the housing 22 prevents water leakage. A water discharging tube 27 supported by the housing 22 extends through the water feeding tube 21 and projects into the interior of the vacuum container 12. A hollow anode 28 is fixedly mounted on the water feeding tube 21 at the end portion projecting into the interior of the vacuum container 12 so as to be rotatable together with the water feeding tube 21. A surface 29 of the rotatable anode 28 which is irradiated with an electron beam (this surface also will be referred to as the soft X-ray emitting surface) is slanted at an inclination angle $\theta$ relative to a perpendicular. On the other hand, a partition or baffle plate 30 is secured to the water discharging tube 27 at the end projecting into the interior of the vacuum container 12 in such an arrangement that a passage for cooling water is defined within the rotatable anode 28. An electron gun 31 (FIG. 1) is supported on the frame structure 11 at a location outside of the space defined above the alignment device 2 and includes a cathode 32 from which the electron beam is emitted. A conduit 34 mounted on the bearing assembly 17 through interposition of an O-ring seal 33 projects into the interior of the vacuum container 12 and has one end opened in opposition to the electron beam irradiated surface 29 of the rotatable anode 28, while the other end of the conduit 34 located externally of the vacuum container 12 is hermetically coupled to the vacuum chamber in which electron gun 31 is disposed. Further disposed within the vacuum container 12 is an electrode member 36 which is provided with a hole for receiving therethrough the conduit 34 and an opening 35 through which the soft X-rays generated at the rotating anode 28 is transmited. This electrode 36 serves to decelerate the electrons repulsed by the rotating anode 28. The opening 35 is attached with a metal mesh having a high aperture ratio for the purpose of keeping the window member 14 from being injured by passing-through electrons repulsed from the rotating anode 28. A cylinder 38 is supported by a bracket 37 which is mounted beneath the bottom of the frame structure 11 and has a rod to which a shutter 39 is secured. Through actuation of the cylinder 38, the path of the soft X-rays transmitted through the window 14 can be opened or closed.

The electron beam from the electron gun 31 is focused onto the surface 29 of the rotating anode 28 through an electron lens 40 so as to form a focal spot of a predetermined diameter for irradiating the surface 29 after having passed through the conduit 34. The soft X-rays emitted from the irradiated surface 29 are taken out through the window 14 to irradiate the substrate 4 through the mask 3.

By virtue of the structure described above, there arises no necessity for increasing the distance between the soft X-ray source and the window 14 even when the diameter of the cathode 32 is enlarged with a view to increase the output power of the electron gun 31. Accordingly, an increment in the output power of the electron gun 31 can be reflected straightforwardly as an increment in the flux density of the soft X-rays with which the substrate 4 is irradiated or exposed. Further, because the diameter of the electron beam focused onto the surface 29 can be varied and adjusted with the aid of the electron lens 40, it is possible to control or regulate the area of the soft X-ray emitting surface region 29 in such a manner that a penumbra blur of a pattern transferred onto the substrate 4 can be minimized.

Thus, the use of the electron gun 31 capable of producing a high output power is facilitated, while the utilization efficiency of the soft X-rays can be enhanced, allowing the throughput to be increased.

Exposure time is determined in dependence on the amount of exposure at a location within the irradiated region where the intensity of the soft X-rays (flux density of the soft X-ray per unit area) is at minimum. Accordingly, it is also one of important problems to increase the flux density at a location within the irradiated region of the substrate where the flux density is at minimum.

The soft X-rays are generated by irradiating the anode with the acceleration electron beam due to interactions between atoms of the anode material and electrons of the electron beam.

Figure 3:
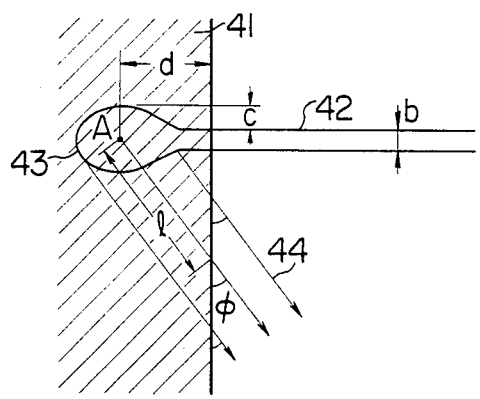
FIG. 3 is a view for schematically illustrating a manner in which soft X-rays are generated.

FIG. 3 is a view schematically illustrating the generation of soft X-rays. When an anode 41 is irradiated with an electron beam 42, soft X-rays 44 are generated at a region which is located interiorly of the anode 41 with a small distance from the surface thereof. The generated soft X-rays 44 transmits through the mass of the anode 41 to the surface thereof and the soft X-rays propagate to the mask and substrate. The soft X-rays are attenuated in proportion to the distance of transmission within the anode. In FIG. 3, b represents the diameter of the electron beam, c represents the spreading of the electron beam in the mass of the anode, d represents the average depth of a region at which the soft X-rays are generated, and A represents the center of the soft X-ray generating region. In general, the diameter b of the electron beam is in the range of 1 to 20 mm, the spreading c is less than 5 μm. The average depth d is about 3 μm when the anode 41 is made of aluminum or silicon and it is irradiated with the electron beam 42 accelerated at the accelerating voltage of 20 KV.

The average transmission distance l of the soft X-rays generated at the region 43 and leaving the surface of the anode 41 at an angle $\phi$ is determined in accordance with the following equation:

$$l = d/\sin \phi \quad (1)$$

The transmittanace $t_t$ of the anode 41 to the soft X-rays generated therein is given by $$t_t = \exp(-\mu l) \quad (2)$$

where $\mu$ represents the absorption factor of the soft X-rays to the anode material. From the equation (1), the equation (2) can be rewritten as follows:

$$t_t = \exp(-\mu d/\sin \phi) \quad (3)$$

When the intensity of the soft X-ray generated within the anode 41 is represented by $I_O$ while the intensity of the soft X-rays emitted from the surface of the anode 41 is represented by $I_t$, the latter is determined in accordance with the following equation:

$$I_t = I_O \exp(-d/\sin \phi) \quad (4)$$

Figure 4:
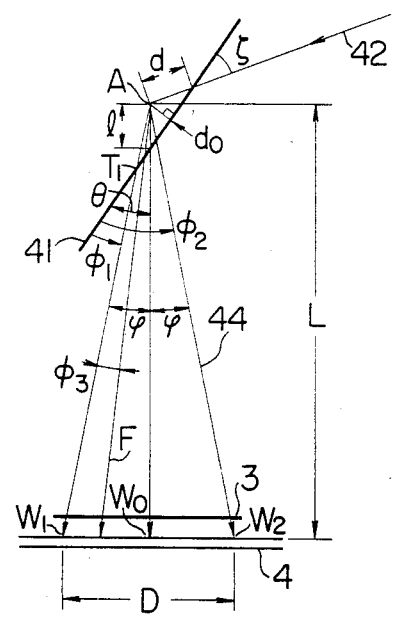
FIG. 4 is a schematic view for illustrating irradiation with the soft X-rays.

FIG. 4 is a view illustrating schematically irradiation of a substrate with the soft X-rays. In this figure, same components as those shown in FIG. 3 are denoted by same reference symbols. Referring to FIG. 4, numeral 3 denotes a mask, 4 denotes a substrate, D represents a range or area of the substrate 4 to be exposed to the soft X-rays, L represents the distance between the center A of the soft X-ray generating region and the top surface of the substrate 4, $T_1$ represents a location or position at whiah the soft X-rays 44 are emitted from the anode 41, $\theta$ represents an angle formed between the surface of the anode 41 and a vertical line extending from the center A perpendicularly to the plane of the substrate 4, $\phi_1$ is an angle formed between the surface of the anode 41 and a line segment extending from the center A to a point $W_1$ on the substrate 4, $\phi_2$ represents an angle formed between the surface of the anode 41 and a line segment extending from the center A to a point $W_2$ on the substrate 4, $\zeta$ represents an angle at which the soft X-rays 44 generated at the center A are diverged during travel for the distance L so as to cover the range D required to be exposed, $d_O$ represents a vertical distance between the center A and the surface of the anode 41, and $\xi$ represents an angle of incidence of the electron beam relative to the surface of the anode 41.

As will be apparent from the illustration of FIG. 4, it is possible to irradiate the substrate 4 over the required range D, so far as the angular condition of $\theta > \zeta$ is satisfied. With regard to distribution of intensity of the soft X-rays 44 within the desired range D to be irradiated, the intensity is highest at the point $W_2$ where the intra-anode transmission distance l is shortest, while the intensity is lowest at the point $W_1$ where the distance l is longest. The exposure time required for irradiation with the soft X-rays depends on the amount of exposure at the location $W_1$ where the intensity of the soft X-rays 44 is most feeble. Accordingly, the exposure time can be shortened by increasing the intensity of the soft X-rays at the location $W_1$.

Figure 5:
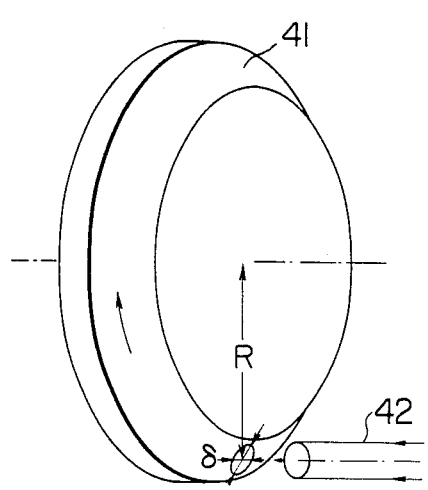
FIG. 5 shows in a perspective view an anode in the state irradiated with an electron beam.

The total energy of X-rays generated in the soft X-ray generator of the rotating anode type is proportional to the total power of the electron beam impinging onto the rotating anode on the assumption that the accelerating energy for the electron beam is constant. Further, tolerable load of the rotating anode is determined in dependence on a temperature rise due to instantaneous impact or bombardment of the electron beam and an average temperature rise resulting from repetition of the electron impacts. A factor of the average temperature rise may be neglected by cooling the rotating anode sufficiently. Accordingly, the tolerable load $W_s$ of the rotating anode is given by $$W_s \propto \gamma \sqrt{\delta} \cdot \sqrt{KCT_m^2} \cdot \sqrt{2NR} \quad (5)$$

where
- $\gamma$: longer diameter of a focal spot of the electron beam focused on the rotating anode 41 (refer to FIG. 5),
- $\delta$: shorter diameter of the focal spot of the same electron beam,
- K: thermal conductivity of the rotating anode material,
- C: specific heat of the anode material,
- $T_m$: melting point of the anode material,
- N: number of rotation per unit time of the anode, and
- R: radial distance between the rotation axis of the anode and the center of the focal spot of the electron beam.

In consideration of the above expression (5), the equation (4) can be rewritten as follows:

$$I_t \propto \gamma \sqrt{\delta} \cdot \sqrt{KCT_m^2} \cdot \sqrt{2NR} \cdot \exp(-\mu d/\sin \phi) \quad (6)$$

When $\sqrt{KCT_m^2} \cdot \sqrt{2NR}$ is represented by $B_O$, the expression (6) is simplified as follows:

$$I_t \propto B_O \cdot \gamma \sqrt{\delta} \cdot \exp\left(-\mu d \frac{\sin \xi}{\sin \phi}\right) \quad (7)$$

It will be appreciated from the expression (6) that the intensity $I_t$ of the soft X-rays emitted from the anode 41 can be increased by enlarging the longer diameter $\gamma$ of the focal spot of the electron beam 42 irradiating the anode 41. However, when the longer diameter $\gamma$ is increased, the area $\tau(=\gamma \sin \theta)$ of the region at which the soft X-rays are generated is increased in appearance.

Figure 6:
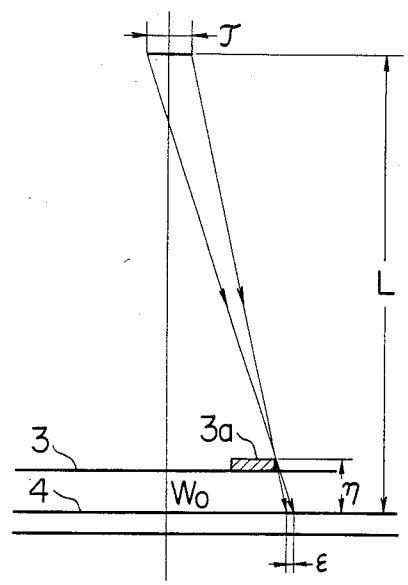
FIG. 6 illustrates in a schematic diagram a relationship between the size of a soft X-ray generating source and a radial blur or penumbra.

Under the circumstances, a penumbra $\epsilon$ corresponding to the dimension $\tau$ of the soft X-ray generating region will be produced in the direction of the longer diamter $\gamma$, as is illustrated in FIG. 6. More particularly, the penumbra $\epsilon$ produced by a pattern 3a formed on the mask 3 is given by $$\epsilon \approx \eta \tau / L \quad (8)$$

where $\eta$ represents an exposure gap between the pattern 3a and the substrate 4. Similarly, a penumbra is produced in the direction of the shorter diameter $\delta$ as well. This penumbra $\epsilon_O$ is given by $$\epsilon_O \approx \delta / L \quad (9)$$

When $\tau$ is selected to be equal to $\delta$ so that the penumbra $\epsilon$ be uniform, the expression (7) can be rewritten as $$I_t \propto B_O (\sqrt{\delta})^3 \cdot \exp\left(-\mu d \frac{\sin \xi}{\sin \phi}\right) / \sin \theta \quad (10)$$

or alternatively $$I_t \propto B_O (\sqrt{\epsilon_O L/\eta})^3 \cdot \exp\left(-\mu d \frac{\sin \xi}{\sin \phi}\right) \sin \theta \quad (11)$$

In the above expression (11), the term $B_O (\sqrt{\epsilon_O L/\eta})^3$ represents a quantity which is determined in designing the X-ray lithography apparatus. Accordingly, in order that the soft X-rays generated in the anode be utilized most effectively, the angle $\theta$ of the anode surface inclination should be so selected that a quantity $F(\theta)$ represented by the expression (12) mentioned below becomes maximum.

$$F(\theta) = \exp(-\mu d \sin \xi / \sin \phi) / \sin \theta \quad (12)$$

With regard to the area $W_1$ where the intensity of the soft X-rays is most feeble, it applies valid that $\phi = \theta - \zeta$. Accordingly, the expression (12) can be rewritten as follows:

$$F(\theta) = \exp\{-\mu d \sin \xi / \sin (\theta - \zeta)\} / \sin \theta \quad (13)$$

Thus, by determining the angle $\theta$ at which $F(\theta)$ is at maximum, it is possible to attain the highest intensity of the soft X-rays at the portion $W_1$.

By way of numerical example, when $L=200$ mm and $D=30$ mm, then $\zeta=4.3°$. Further, when the electron beam 42 is so orientated as to be perpendicular to the line segment $\overline{AW_O}$, then $\epsilon=90°-\theta$. In the following Table 1, the maximum values of $F(\theta)$ and the corresponding angles $\theta$ are listed together with the anode materials and the wavelengths of the soft X-rays, which data were measured on the condition that the accelerating voltage for the electron beam 42 is set at 20 kV.

TABLE 1

| Anode Material | Al | Si | Mo | Pd | Ag |
|---|---|---|---|---|---|
| Wavelength (Å) of soft X-ray | 8.334 | 7.126 | 5.406 | 4.368 | 4.154 |
| Maximum value of F ($\theta$) | 1.42 | 1.68 | 0.77 | 0.99 | 1.05 |
| Angle $\theta$ (degree) | 17.8 | 15.4 | 32.0 | 25.0 | 23.5 |

By determining the angle $\theta$ of the irradiated surface 29 of the rotating anode 28 shown in FIGS. 1 and 2 in the manner described above, it is possible to increase the throughput of the X-ray lithography apparatus 1.

This concept to optimize the angle $\theta$ for increasing the X-ray output is apparently and indentically applicable for stationary target, especially for conical cone type X-ray tube.

As will be seen from FIG. 4, the soft X-rays 44 generated at the point A in the anode 41 and spreading or diverging radially from the point A, differ from one another with respect to the transmission distance within the mass of the anode material in dependence on the surface positions at which the individual soft X-rays are emitted from the surface of the anode 41. In other words, the intensity of the soft X-rays emitted from the surface of the anode 41 varies in dependence on the difference of the transmission distances by which the soft X-rays are absorbed in the anode material. As the consequence, the intensity of the soft X-rays 44 which reach the wafer 4 through the mask 3 varies among various points on the wafer 4. The intensity $I_t$ of the soft X-rays 44 emitted from the anode 41 is given by $$I_t = I_O \exp\left\{-\left(\frac{\mu}{\rho}\right) \cdot \frac{\sin \xi}{\sin (\phi_1 + \phi_3)} \cdot \frac{1}{60} (V^{1.7} - V_k^{1.7}) \frac{B}{Z}\right\} \quad (14)$$

where ($\mu/\rho$): mass absorption coefficient of the anode,
$\phi_3$: angle of the line segment F,
V: electron beam accelerating voltage,
$V_k$: exitation energy for soft X-rays determined by the anode material,
B: atomic weight of the anode material, and
Z: atomic number of the anode material.

For example, on the conditions that the anode is made of aluminum, $\xi=70°$, $\theta=20°$, $L=130$ mm and that $D=20$ mm, difference amounting to about 30% is produced in intensity among the soft X-rays impinging on the wafer 4.

Figure 7:
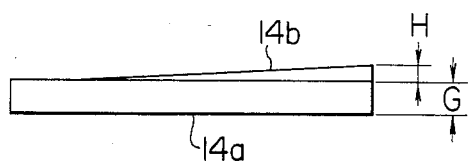
FIG. 7 shows in a side view an exemplary structure of a window used in the generator shown in FIG. 2 for taking out the soft X-rays.

To obviate the difference in intensity of soft X-rays mentioned above, the window member 14 of the soft X-ray generating apparatus through which the soft X-rays are taken out may be constituted by a base 14a of beryllium and a layer 14b of beryllium, titanium or the like which is deposited over the base 14a and serves to absorb a part of the soft X-rays, as shown in FIG. 7. Any material can be used for forming the layer 14b so far as it allows the soft X-rays to transmit therethrough. The layer 14b is imparted with a thickness H which is so determined on the basis of intensity of the soft X-rays given by the relationship (14) and the transmittance of the layer 14b to the soft X-rays that the intensity distribution of the soft X-rays reaching the base 14a be uniform. In this connection, the thickness of the layer 14b may be varied continuously as shown in FIG. 7 or alternatively stepwise.

By virtue of the structure of the window 14, a uniform distribution of intensity can be obtained for the soft X-rays 44 taken out through the window 14 for irradiating the mask 3 and the wafer 4.

What is claimed is:

1. A soft X-ray generator comprising an electron gun for generating an electron beam, an anode irradiated with the electron beam to generate soft X-rays, and a vacuum chamber for containing said electron gun and said anode, wherein an incident angle $\xi$ of the electron beam with respect to said anode, an angle $\theta$ formed between said anode and a line interconnecting a point at which the soft X-rays are generated in said anode and the center of a field of irradiation by the soft X-rays, and an angle $\zeta$ formed between the line interconnecting said soft X-ray generating point and the center of said field of irradiation and a line interconnecting said soft X-ray generating point and an outer peripheral edge of said field of irradiation are selected so that a function $$F = \frac{1}{\sin \theta} \exp\left(\frac{-\mu d \sin \xi}{\sin (\theta - \zeta)}\right)$$

becomes a maximum, F being the intensity of the soft X-rays at a location in said field of irradiation where said intensity is most feeble, $\mu$ being the soft X-ray absorption coefficient of said anode and d being an average depth of said soft X-ray generating point in said anode, and wherein said electron gun, said anode and said field of irradiation are arranged at locations determined by the selected angles $\xi$, $\theta$ and $\zeta$.

2. A soft X-ray generator according to claim 1, further comprising a metal mesh of high aperture ratio within said vacuum chamber between said soft X-ray generating point and said field of irradiation.

3. A soft X-ray generator according to claim 1, further comprising a window within said vacuum chamber between said soft X-ray generating point and said field of irradiation, said window making the intensity distribution of the soft X-rays uniform.

4. A soft X-ray generator according to claim 3, wherein said window includes a layer made of a material which serves to absorb a part of the soft X-rays.

5. A soft X-ray generator according to claim 1, further comprising a conduit within said vacuum chamber for guiding the electron beam from said electron gun onto said anode in a focused form.

6. A soft X-ray generator according to claim 5, wherein said conduit has a length sufficient for focusing the electron beam from said electron gun.

7. A soft X-ray generator according to claim 1, wherein said anode includes a rotatable body having a side face irradiated with the electron beam from said electron gun.

8. A soft X-ray generator according to claim 7, wherein said rotatable body has a hollow configuration for permitting coolant to flow into the interior of said body.

9. A soft X-ray generator comprising:
an anode irradiated with an electron beam to generate soft X-rays;
a first vacuum container provided with a window member through which said soft X-rays are taken out, said first container accommodating therein said anode;
an electron gun for generating said electron beam;
a second vacuum container for accommodating therein said electron gun;
a conduit disposed between said first and second vacuum containers for coupling said containers to each other and guiding said electron beam from said electron gun to said anode;
an electron lens mounted in combination with said conduit for focusing said electron beam guided through said conduit onto said anode electrode; and
wherein said anode has a surface for receiving said electron beam, said surface being inclined relative to a line interconnecting a point at which the soft X-rays are generated and the center of a field of irradiation so that the following quantity $F(\theta)$ becomes maximum, $$F(\theta) = \exp\left(\frac{-\mu d \sin \xi}{\sin (\theta - \zeta)}\right) / \sin \theta$$

where
$F(\theta)$: intensity of the soft X-rays at a location of said field of irradiation where said intensity is most feeble,
$\mu$: absorption coefficient of the soft X-rays of the anode material,
d: average depth of the portion at which the soft X-rays are generated,
$\xi$: incident angle of the electron beam.
$\theta$: angle formed between the electron beam receiving surface of said anode electrode and the line interconnecting the soft X-ray generating point and the center of the field of irradiation, and
$\zeta$: angle formed between the line interconnecting the soft X-ray generating point and the center of the field of irradiation and a line interconnecting the soft X-ray generating point and an outer peripheral edge of said field of irradiation.

10. A soft X-ray generator according to claim 9, wherein said anode electrode is implemented in a disclike configuration having passages for coolant formed in the interior and is supported rotatably within said first vacuum container.

11. A soft X-ray generator according to claim 9, wherein said window member has a layer formed thereon, said layer serving to absorb a part of the soft X-rays.

* * * * *